(12) United States Patent
Bajic et al.

(10) Patent No.: US 9,172,023 B2
(45) Date of Patent: Oct. 27, 2015

(54) ELECTROTHERMAL TRANSDUCER, AND TEMPERATURE CONTROLLING DEVICE

(75) Inventors: Goran Bajic, Belle River (CA); Syed Iqbal, Tecumseh (CA); Dmitri Axakov, Waterloo (CA); Tim Normand, Lasalle (CA)

(73) Assignee: GENTHERM GMBH, Odelzhausen (DE)

( * ) Notice: Subject to any disclaimer, the term of this patent is extended or adjusted under 35 U.S.C. 154(b) by 1556 days.

(21) Appl. No.: 12/674,533

(22) PCT Filed: Aug. 22, 2008

(86) PCT No.: PCT/DE2008/001374
§ 371 (c)(1),
(2), (4) Date: Sep. 21, 2011

(87) PCT Pub. No.: WO2009/026890
PCT Pub. Date: Mar. 5, 2009

(65) Prior Publication Data
US 2012/0000901 A1 Jan. 5, 2012

(30) Foreign Application Priority Data

Aug. 24, 2007 (DE) .......... 10 2007 040 264
Nov. 9, 2007 (DE) .......... 10 2007 053 869
Dec. 12, 2007 (DE) .......... 10 2007 060 312

(51) Int. Cl.
*B23K 13/08* (2006.01)
*H01L 35/32* (2006.01)
*B60N 2/56* (2006.01)

(52) U.S. Cl.
CPC .............. *H01L 35/32* (2013.01); *B60N 2/5678* (2013.01)

(58) Field of Classification Search
USPC ............ 219/202, 217, 476–478, 483, 501
See application file for complete search history.

(56) References Cited

U.S. PATENT DOCUMENTS

| | | | |
|---|---|---|---|
| 2,493,303 A | 1/1950 | McCullough |
| 3,136,577 A | 6/1964 | Richard |
| 3,552,133 A | 1/1971 | Lukomsky |
| 3,653,590 A | 4/1972 | Elsea |
| 3,681,797 A | 8/1972 | Messner |
| 3,684,170 A | 8/1972 | Roof |
| 4,043,544 A | 8/1977 | Ismer |
| 4,065,936 A | 1/1978 | Fenton et al. |

(Continued)

FOREIGN PATENT DOCUMENTS

| | | | |
|---|---|---|---|
| DE | 34 38 266 A1 | 5/1985 |
| DE | 19503291 A1 * | 8/1996 |

(Continued)

OTHER PUBLICATIONS

Chinese Office Action, Application No. 200880110369.0 dated Aug. 9, 2011.
German Office Action, Application No. 102007060312.8 dated Nov. 16, 2010.
Japanese Office Action, Application No. 2010521300 dated Oct. 4, 2011.
International Search Report, Application No. PCT/DE2008/001374, dated Aug. 10, 2009, published as WO2009/026890A3.
Translation of Written Opinion, Application No. PCT/DE2008/001374, dated Mar. 2, 2010.

*Primary Examiner* — Dana Ross
*Assistant Examiner* — Brandon Harvey
(74) *Attorney, Agent, or Firm* — The Dobrusin Law Firm, P.C.

(57) ABSTRACT

The present invention relates to an electrothermal converter, which has at least one cold side and one warm side. Provision is made that all the components of the converter cope with the thermal loads appearing when the converter is operated and/or in particular maintains its mechanical stability.

18 Claims, 3 Drawing Sheets

(56) References Cited

U.S. PATENT DOCUMENTS

Figure 1:
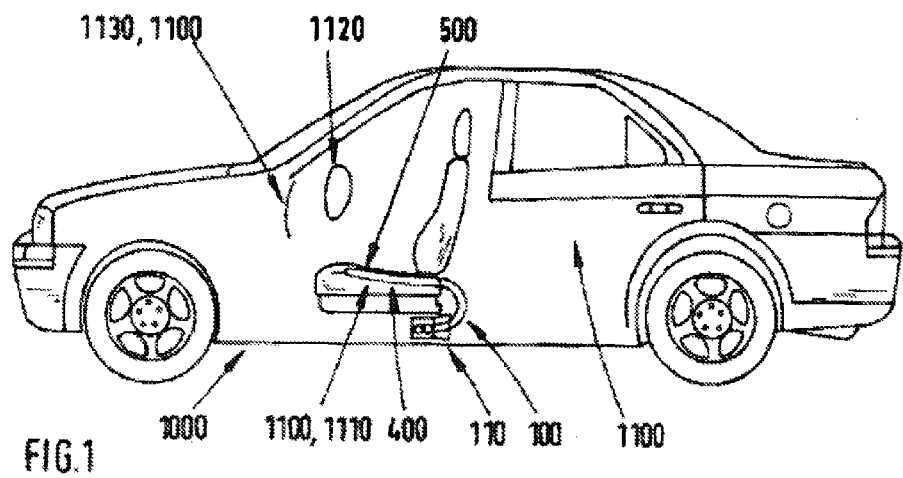

| | | |
|---|---|---|
| 4,572,430 A | 2/1986 | Takagi et al. |
| 4,640,340 A | 2/1987 | Noda et al. |
| 4,665,707 A | 5/1987 | Hamilton |
| 4,777,802 A | 10/1988 | Feher |
| 5,002,336 A | 3/1991 | Feher |
| 5,106,161 A | 4/1992 | Meiller |
| 5,117,638 A | 6/1992 | Feher |
| 5,138,851 A | 8/1992 | Mardikian |
| 5,187,943 A | 2/1993 | Taniguchi et al. |
| 5,524,439 A | 6/1996 | Gallup et al. |
| 5,924,766 A | 7/1999 | Esaki et al. |
| 6,079,485 A | 6/2000 | Esaki et al. |
| 6,085,369 A | 7/2000 | Feher |
| 6,105,667 A | 8/2000 | Yoshinori et al. |
| 6,119,463 A | 9/2000 | Bell |
| 6,124,577 A | 9/2000 | Fristedt |
| 6,186,592 B1 | 2/2001 | Orizaris et al. |
| 6,223,539 B1 | 5/2001 | Bell |
| 6,237,675 B1 | 5/2001 | Oehring et al. |
| 6,254,179 B1 | 7/2001 | Kortume et al. |
| 6,263,530 B1 | 7/2001 | Feher |
| 6,273,181 B1 | 8/2001 | Matsui et al. |
| 6,278,090 B1 | 8/2001 | Fristedt et al. |
| 6,291,803 B1 | 9/2001 | Fourrey |
| 6,300,150 B1 | 10/2001 | Venkatasubramanian |
| 6,347,521 B1 | 2/2002 | Kadotani |
| 6,539,725 B2 | 4/2003 | Bell |
| RE38,128 E | 6/2003 | Gallup et al. |
| 6,598,405 B2 | 7/2003 | Bell |
| 6,606,866 B2 | 8/2003 | Bell |
| 6,619,736 B2 | 9/2003 | Stowe et al. |
| 6,625,990 B2 | 9/2003 | Bell |
| 6,637,210 B2 | 10/2003 | Bell |
| 6,664,518 B2 | 12/2003 | Fristedt et al. |
| 6,672,076 B2 | 1/2004 | Bell |
| 6,687,937 B2 | 2/2004 | Harker |
| 6,700,052 B2 | 3/2004 | Bell et al. |
| 6,719,624 B2 | 4/2004 | Hayashi et al. |
| 6,793,016 B2 | 9/2004 | Aoki et al. |
| 6,826,792 B2 | 12/2004 | Lin |
| 6,828,528 B2 | 12/2004 | Stöwe et al. |
| 6,848,742 B1 | 2/2005 | Aoki et al. |
| 6,886,352 B2 | 5/2005 | Yoshinori et al. |
| 6,957,545 B2 | 10/2005 | Aoki |
| 7,070,232 B2 | 7/2006 | Minegishi et al. |
| 7,231,772 B2 | 6/2007 | Bell et al. |
| 8,070,828 B2 | 12/2011 | Shannon |
| 2002/0017102 A1 | 2/2002 | Bell |
| 2002/0150478 A1 | 10/2002 | Aoki |
| 2003/0029173 A1 | 2/2003 | Bell et al. |
| 2003/0066554 A1 | 4/2003 | Feher |
| 2003/0230402 A1 * | 12/2003 | Leitch et al. .................. 165/178 |
| 2005/0126184 A1 * | 6/2005 | Cauchy ............................ 62/3.3 |
| 2005/0257541 A1 | 11/2005 | Kadle et al. |
| 2006/0174633 A1 | 8/2006 | Beckley |
| 2007/0069554 A1 | 3/2007 | Comiskey et al. |
| 2007/0095378 A1 | 5/2007 | Ito et al. |

FOREIGN PATENT DOCUMENTS

| | | |
|---|---|---|
| DE | 10 2006 013 994 A1 | 10/2006 |
| DE | 60 2004 000 980 T2 | 12/2006 |
| DE | 11 2005 001 237 T5 | 4/2007 |
| DE | 102006050048 A1 | 5/2007 |
| GB | 1025687 A | 4/2003 |
| JP | 2005/333083 A | 12/2005 |
| JP | 2005333083 A * | 12/2005 |
| JP | 2006-234250 A | 7/2006 |
| SE | 0102983 | 3/2003 |
| WO | 2004/114513 A1 | 12/2004 |

\* cited by examiner

ELECTROTHERMAL TRANSDUCER, AND TEMPERATURE CONTROLLING DEVICE

CLAIM OF PRIORITY

The present application claims priority from the 22 Aug. 2008 filed PCT Application PCT/DE2008/001374, which claims priority from German Application Nos. DE 102007040264.5; 102007053869.5; and 102007060312.8, filed on 24 Aug. 2007; 9 Nov. 2007; and 12 Dec. 2007 respectively, disclosure of which is hereby incorporated by reference herein.

THEME OF THE INVENTION

An object of the present invention is an electrothermal converter according to the preamble of claim 1 (Electrothermal converter (112), which has at least one cold side (114) and one warm side (115), characterized in that all components of the converter (112) cope with thermal loads when the converter is operating and/or especially retain their mechanical stability). Such converters are often subjected to strong thermal loadings, such as temperature fluctuations, tensile stresses, etc. They also are under heavy pressure in terms of price.

SUBJECT OF THE INVENTION

Therefore a technical concept according to the independent claims is proposed. Additional advantageous embodiments can be gleaned from the following specification and the other claims.

The invention is especially advantageous in regard to manufacturing costs, safety and service life.

The invention is basically suited for all types of temperature control devices and their use in air conditioners, especially for all bolsters, especially motor vehicle seats, seat covers, paneling elements of passenger compartments, armchairs or office equipment, for example.

FIGURES

In what follows, the particulars of the invention are explained. These explanations should make the invention understandable. However, they are only of an exemplary nature. Naturally, within the framework of the invention, individual and multiple described features can also be omitted, altered or supplemented. Additionally, features of various embodiment forms can naturally be combined with each other. What is decisive is that the concept of the invention in essence is implemented. With this, "in essence" means in particular that the implementation results in the desired utility to a recognizable extent. In particular this may mean that a feature in question is at least 50%, 90%, 95% or 99% fulfilled.

Figure 5:
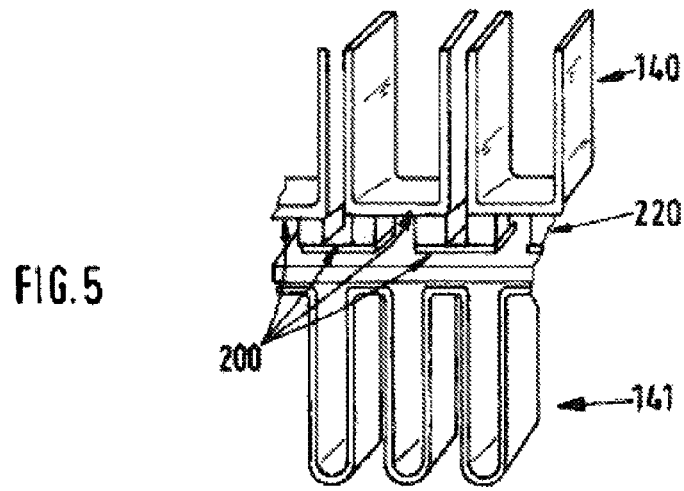
Figure 6:
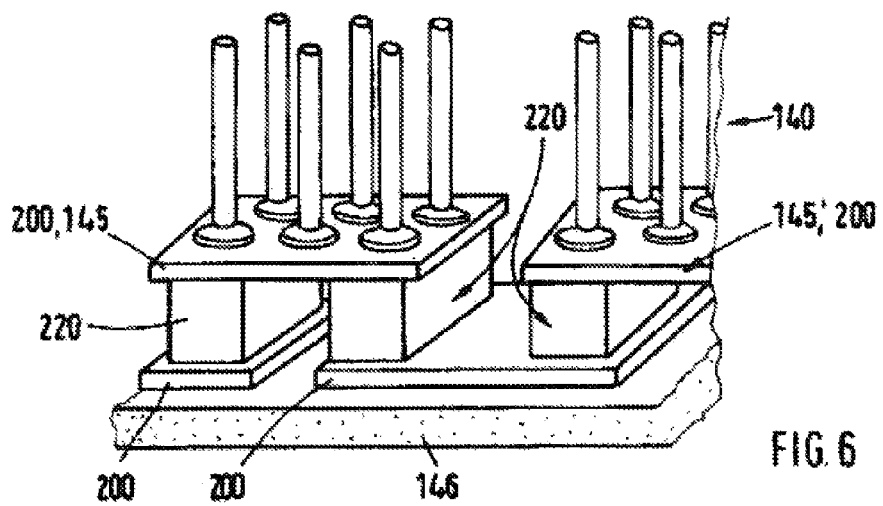
Figure 7:
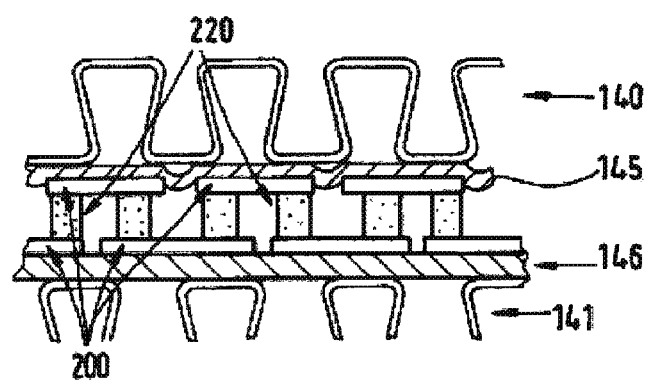

In what follows, reference will be made to:

FIG. 1. A motor vehicle in a partial longitudinal section with an air conditioner FIG. 2. Cross section through an electric converter and a temperature control device of the air conditioner from FIG. 1 with point connections between the individual components FIG. 3. Longitudinal section through a second embodiment form of a thermoelectric converter with corrugated-sheet heat exchangers FIG. 4. Perspective view of a third embodiment form of a thermoelectric converter with segmented heat exchangers FIG. 5. Perspective view of a fourth embodiment form of a thermoelectric converter with U-shaped bridge elements that also serve as heat exchangers FIG. 6. Perspective view of a fifth embodiment form of a thermoelectric converter with a multiplicity of thermally conducting ribs on the bridge elements FIG. 7. Longitudinal section through a sixth embodiment form of a thermoelectric converter with a ceramic and an elastic distributor plate FIG. 8. Perspective view of a seventh embodiment form of a thermoelectric converter with two corrugated sheet heat exchangers with differing orientation of their ribs

SPECIFICATION OF THE INVENTION

FIG. 1 shows a motor vehicle 1000. This can, for example, be an aircraft, an item of railway rolling stock, a ship or, as here, an automobile.

The vehicle 1000 has at least one interior item 1100. In doubtful instances this is meant to be all the components with which a user of the passenger compartment can come in contact, such as a steering mechanism 1120 for the vehicle, a dashboard 1130, an armrest 1140, a door panel 1150, a seat surface 1160, a thermal cover 1170, a vehicle headliner 1180, a bolster 400, a cover 500 or a seat 1110.

The interior item 1100 preferably has at least one bolster 400 and/or at least one cover 500.

The interior item 1100 preferably has at least one air conditioner 100. It is, for example, the temperature controller and air conditioner of surfaces in a vehicle touched by the user. It has at least one temperature control device 110, at least one air ducting device 120 and/or at least one humidity regulator 130. As a temperature controller 140 what is meant is every device that can be used for deliberate alteration of the temperature in its surroundings, for example, all devices with at least one electrical resistance heater, one heat pump, one Peltier element and/or one air circulator, such as a ventilator, or which in essence are formed from one. What is meant by an air circulator is every device that can be used for deliberate alteration of the air composition or of the air flows in a certain planar or three-dimensional area for air exchange, such as an onboard air conditioner, at least partially air-permeable spacer media, spacer textures and/or air conditioning inserts. What is meant by a humidity regulator 130 is a device that serves to regulate the air humidity in its environs, especially the specified temperature control devices 110, humidity absorbers such as activated charcoal fibers or polymeric superabsorbers.

The temperature control device 110 is attached via a connecting cable 119 to a current source 150.

An electrothermal converter 112 is a device for converting electrical energy into thermal energy and/or for generating a temperature gradient between two locations by means of electrical energy. Examples of this are Peltier elements.

Figure 2:
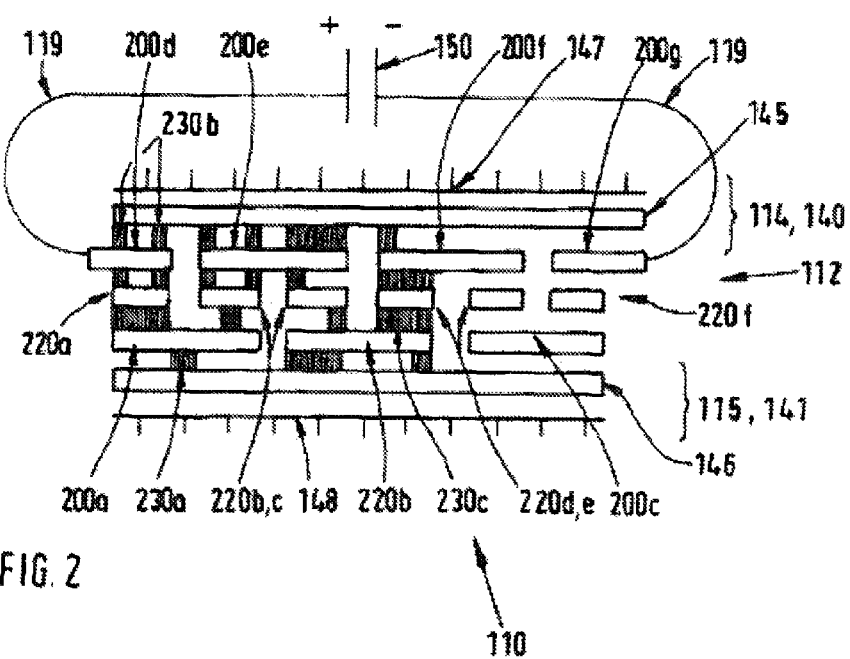
Figure 3:
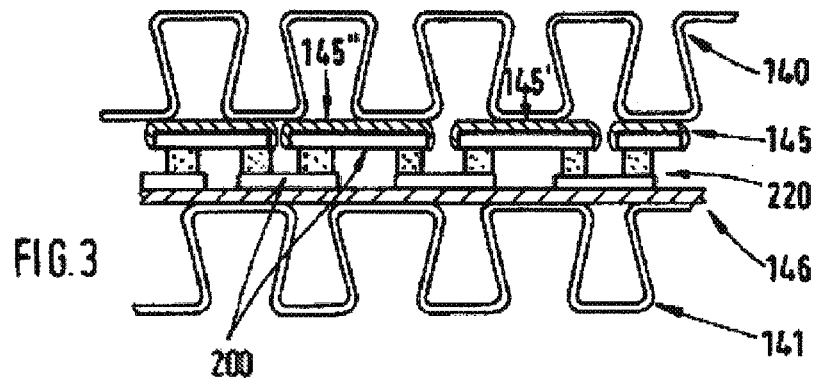

FIG. 2 shows a temperature controller 110 with an electrothermal converter 112 having at least two electrical semiconductor components 220 *a-f*. One semiconductor element is at least partially P doped, the other at least partially N doped. These are situated alternately and in sandwich fashion between bridge elements 200 *a-g*. By this means, an electrothermal converter 112 is created in a series connection of semiconductor components. If current flows through this arrangement, then one side of the semiconductor components becomes colder, and the other side warmer.

A cold side 114 is thus a side of the electrothermal converter 112 that is cooled when the converter operates. As the design dictates, this may always stay the same, or be capable of polar reversal depending on the current flow.

A warm side 115 is a side of the electrothermal converter 112 which is heated when the converter is in operation.

The semiconductor components 220 and the bridge elements 200 a-g can be joined by welding, soldering and/or gluing by an electrically conducting adhesive. This joining can occur over a full or broad surface, or partially and pointwise.

Thermally conducting adhesives are especially suited for bonding. These are materials that are good at conducting heat, to minimize transmission loss of the electrothermal converters 112 to the heat exchanger devices 140, 141 and to permit at least two objects to adhere at least slightly to each other. Examples of these are silicon-free thermally conducting pastes such as those based on synthetic fats with metallic admixtures like zinc oxide particles. Further examples are two-component adhesives such as epoxy-based ones. Additionally, PSA-based adhesives are suitable. The adhesives can be applied as fluid adhesives. But they also could be applied as an adhesive strip. An example is a thermally conducting PSA adhesive strip reinforced by an electrically conducting foil such as Kapton™. Additionally, waxes and resins could be considered, especially if they are mixed with metals or metal oxides. When components of temperature control device 110 are glued, preferably an adhesive is used that is still elastic and/or capable of creep. By this means, the semiconductor components obtain play to be able to stretch without tears or breaks.

It is also possible to assign bridge elements 200 in the form of conducting strips made of tin, copper, silver printing paste and/or electrically conducting adhesives.

The thermoelectric converter 112 preferably has a heat exchanger 140, 141 consisting of at least one cold or warm side 114, 115. Preferably at least a share of this is manufactured from a material with good thermal conductivity like aluminum or copper.

Figure 4:
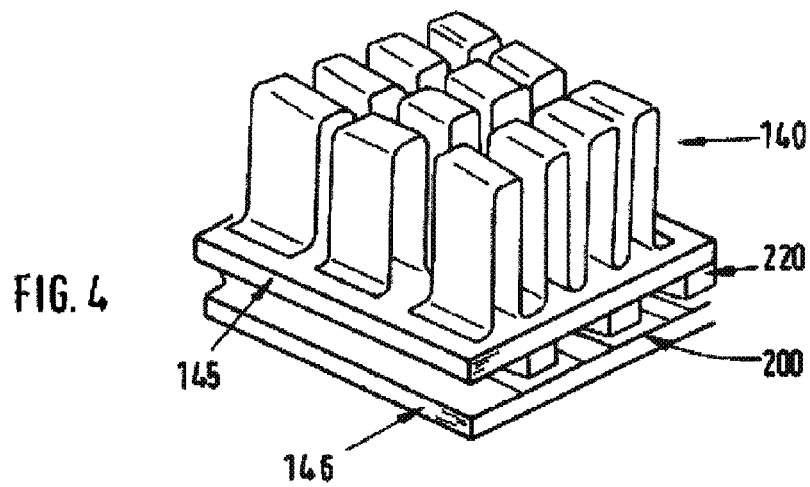

It can cover over all the semiconductor components 220 of the electrothermal converter 112 (FIG. 2). However, it could also be assigned only to certain semiconductor components (FIG. 4). In this case, preferably multiple heat exchangers are situated at intervals next to each other. Since these have mobility relative to each other, and exert no forces on each other, thermal stresses are thereby reduced. In the ideal case, one (FIG. 5) or more (FIG. 6) heat exchangers 140, 141 are assigned to each pair of semiconductor components 220 connected by a bridge element 200 a-g. The heat exchanger device can have a corrugated-sheet structure as in FIG. 3, and/or cooling ribs as in FIG. 2 and/or u-shaped profile bends as in FIG. 5. The heat exchangers of the cold and warm side 140, 141 can be configured in the same manner or differently.

To electrically insulate the semiconductor components 220 and the bridge elements 200 a-g from the heat exchangers 140, 141, for better distribution of mechanical loads, and for homogenizing of thermal flows, at least one distributor plate 145, 146 can be provided between at least one heat exchanger 140, 141 and at least one semiconductor component 220 or a bridge element 200 a-g. Provision can be made that distributor plates 145, 146 be situated that are identical or different from each other both on the hot and cold side.

At least one distributor plate 145, 146 is preferably made of a ceramic material. Especially favorable are DBC ceramics because they are more robust than traditional ceramic materials.

Provision can be made that at least one distributor plate 145, 146 can be made at least partially from Kapton. This material is a thermal conductor but an electrical insulator. It permits greater stretching of the electrothermal converter 112 than ceramic materials that are more brittle.

At least one distributor plate 146 is preferably made of a material that is more elastic than the material of at least one additional (such as the first) distributor plate 145. For this, a non-electrically-conducting polymer, for example, is suitable.

Figure 8:
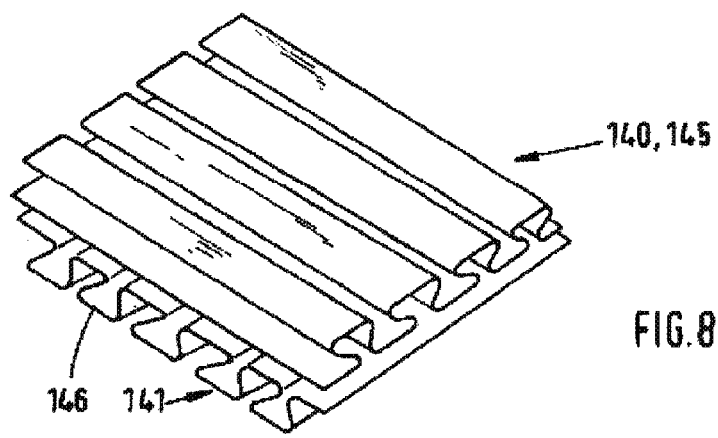

In appropriate fashion the distributor plates 145, 146 are able to bend in one direction and are stiff in another direction. This can for example be attained in that they are bent or curved in corrugated sheet fashion. In appropriate fashion the distributor plates of the hot and cold sides are turned 90° to each other (FIG. 8). By this means it is ensured that they will at most exert slight tensile stresses on each other. It can be appropriate to make the distributor plates 145, 146 of metal, to equip them with additional ribs, or to provide them with an elastic, conducting filler. Especially with this type, additional heat exchangers 140, 141 can be dispensed with, and this function can be assumed by the distributor plates 145, 146.

Semiconductor components 220 are appropriately situated so that they are placed along the ribs or the mountain & valley structure of the distributor plates 145, 146. This improves heat flux and minimizes stresses.

Provision can also be made that only the hot, or only the cold side, be provided with a distributor plate 145, 146. By this means likewise thermal stresses are lowered which are produced from the differing thermal expansion on the warm and cold sides.

To ensure that the semiconductor components 220 are electrically insulated against their environment, for such structures an insulating layer can be provided, for example in the form of a polymeric film and/or dual-sided adhesive strip between heat exchanger 140 and the semiconductor components 220. Such an insulating layer can simultaneously cover bridging devices. For that, we recommend that the insulating layer have abdomen-like meanders or bends between the various bridging devices, to prevent stresses.

However, a separate insulating layer for each bridging element can be provided. For both purposes, layerings with a dielectric are appropriate, which are sprayed on, printed on, rubbed in, sputtered, etc. Especially suitable as material components are paint, enamel, cement, rubber, etc.

Preferably between at least one electrothermal converter 112 and at least one distributor plate 145, 146 and/or one heat exchanger 140, 141, at least one connection zone 230 is provided, on which the electrothermal converter 112 is connected with the heat exchanger 140, 141 or the distributor plate 145, 146 or the distributor plate 145, 146 with at least one of the two other components.

The bridging elements 200 a-g can be connected with the heat exchangers 140, 141 and/or the distributor plates 145, 146 in the same way as between the bridge elements 200 and the semiconductor components 220. Preferably the connection is manufactured at least in part from an artificial resin, epoxy adhesive and/or indium solder. Since these materials at least to a certain extent allow a stretching of the electrothermal converter 112 or of the heat exchanger 140, 141, a large-area or full-area attachment of the connection zone 230 between the distributor plates 145, 146 and the electrothermal converter 112 or the heat exchanger 140, 141 is a possibility, even if the heat exchanger 140, 141 is made of copper and the distributor plates 145, 146 are made of ceramic.

Now in what follows, various versions are described, to give the semiconductor components 220 an opportunity to follow thermal expansion movements and at the same time to obtain a fixed temperature control element.

It is decisive that the warm side of a semiconductor component 220 obtains the possibility to arch up in its middle and the cold side can at least slightly raise its edge areas. For that it is appropriate that at least two of the components of the temperature control device 110 and/or of the electrothermal converter 112 be only partially bonded with each other.

Version a) We securely glue a point in the center of the semiconductor components 220 on the bridging elements of the hot side of the temperature control device 110. If the point is small enough, the semiconductor component 220 can bend away from the hot side, even if the adhesive is hard and non-elastic. The zone of adhesive bonding zone 230 may be in the middle or on the edge. It preferably constitutes less than 70% of the basic surface of semiconductor component 220, preferably less than 55% or 30%.

On the opposite cold side 114, the semiconductor components 220 are glued pointwise or over the full surface with the bridging element. However, in this area they are not provided with full-surface attachment on the ceramic plates, but rather at least in part are not attached there—preferably not at all. At best they are connected only at zones between the individual semiconductor components 220 with the ceramic plate. By this means, the edges of the semiconductor components facing the cold side 114 obtain a possibility to move toward one another and the inner area of the base surface can lift off from the cold side 114. The bridging elements can for example be reinforced by foils or textiles, for example with components of polymers like polyurethane and/or metals.

Version b) The semiconductor components 220 are glued on the hot side 115 on a ring and/or frame, which in the middle has a planar recess into which the semiconductor component 220 can warp during heating and expansion.

On the cold side 114, the semiconductor component 220 lies in the middle on a raised surface so that on the edges it has an encircling gap. This gives play to the semiconductor component 220, to bend with its cooling, contracting areas toward the cold side 114. Here it is advantageous if the ring, frame and/or the raised surface are formed at least in part from the jumper material, from soldered, welded or sintered metal and/or from electrically and/or thermally conducting adhesive.

Version c) We glue the semiconductor component only on one edge on the hot ceramic plate. We also securely glue the semiconductor component cold side only on one edge on the cold ceramic plate, but the two edges lie at ends of the semiconductor component 220 that lie opposite each other. Then the semiconductor component 220 has play if it moves the ceramic plate somewhat to the side and upwards.

The temperature control device 110 preferably is in an air conditioner. There a first air stream is directed along the one side of the temperature control device 110. By this means it absorbs heat, for example. If heating is to be done, then this heated stream is fed to the user. A second air stream runs past the opposite heat exchanger 140, 141. There it releases its thermal energy to the heat exchanger and is cooled thereby. If cooling is to be done, this air stream is fed to the user.

REFERENCE SYMBOLS

100 Air conditioner
110 Temperature control device
112 Electrothermal converter
114 Cold side
115 Warm side
119 Connecting cable
120 Air ducting device
130 Moisture regulator device
140 Heat exchanger, cold side
141 Heat exchanger, warm side
145, 146 Distributor plates
150 Current source
200 a-g Bridge elements
220 a-f Semiconductor components
230 a-c Connection zone
400 Bolster
500 cover
1000 Vehicle
1100 Interior item
1110 seat
1120 Steering wheel
1130 Dashboard
1140 Armrest
1150 Door panel
1160 Seat support
1170 Thermal cover
1180 Vehicle headliner

The invention claimed is:

1. A temperature controller comprising:
an electrothermal converter having:
(i) at least one heat exchanger having a rib structure with at least one inward bend and at least one outward bend;
(ii) at least two electrical semiconductor components with a warm side and a cold side when in operation, the at least two electrical semiconductor components at least partially joined to and situated alternately and in a sandwich fashion between at least one bridge element;
(iii) at least one distributor plate between the at least one heat exchanger and the at least one bridge element;
wherein at least one of the inward bends is located adjacent to at least one of the two electrical semiconductor components and at least one of the outward bends is spaced from the electrical semiconductor components;
wherein the at least one distributor plate electrically insulates the at least two electrical semiconductor components and the at least one bridge element from the at least one heat exchanger; and
wherein the at lease on distributor plate is flexible in one direction and inflexible in another direction and the at least one distributor plate includes ribs or a mountain and valley structure.

2. The temperature controller according to claim 1, wherein the at least two electrical semiconductor components are joined to the at least one bridge element by a bonding zone; and
wherein the bonding zone comprises a glue joint.

3. The temperature controller according to claim 2, wherein the glue joint comprises an adhesive that remains elastic and/or is capable of creep.

4. The temperature controller according to claim 3, wherein the adhesive is electrically conductive.

5. The temperature controller according to claim 1, wherein the semiconductor components are placed along the ribs or the mountain and valley structures.

6. The temperature controller according to claim 1, wherein the at least two electrical semiconductor components are joined with glue at a bonding zone at a point in the middle of each of the at least two electrical semiconductor components on the bridge elements of the warm side of the temperature controller such that the semiconductor component can bend away from the warm side, even if the adhesive is hard and non-elastic.

7. The temperature controller according to claim 6, wherein the bonding zone constitutes less than 30% of a basic surface of semiconductor component.

8. The temperature controller according to claim 6, wherein on the cold side, the semiconductor components are joined with a bonding zone pointwise or over a full surface with the bridge element, furthermore in this area they are not provided with full-surface attachment on the distributor plate, but rather at least in part are not attached thereto, thus the edges of the semiconductor components facing the cold side obtain a possibility to move toward one another and an inner area of the base surface can lift off from the cold side.

9. The temperature controller of claim 1, wherein the at least one heat exchanger's rib structure is a corrugated sheet structure.

10. The temperature controller of claim 1, wherein the at least one heat exchanger's rib structure is a u-shape bend profile.

11. The temperature controller of claim 1, wherein at least one of the heat exchangers is located on the cold side of the electrothermal converter and at least one of the heat exchangers is located on the warm side of the electrothermal converter; and
the rib structure of the cold side heat exchanger is offset from the rib structure of the warm side heat exchanger such that the inward bends and outward bends of each heat exchanger are not aligned.

12. The temperature controller of claim 1, wherein at least one of the heat exchangers is located on the cold side of the electrothermal converter and at least one of the heat exchangers is located on the warm side of the electrothermal converter; and
the rib structure of the cold side heat exchanger is aligned with the rib structure of the warm side heat exchanger such that the inward bends of the cold side heat exchanger are aligned with the inward bends of the warm side heat exchanger.

13. The temperature controller of claim 1, wherein the at least one distributor plate is only located on the warm side.

14. The temperature controller of claim 1, wherein the at least one distributor plate is only located on the cold side.

15. The temperature controller of claim 1, wherein one of the least one heat exchangers is located on the cold side of the electrothermal converter and another of the at least one heat exchangers is located on the warm side of the electrothermal converter; and
the rib structure of the cold side heat exchanger having a profile that differs from a profile of the rib structure of the warm side heat exchanger.

16. The temperature controller of claim 1, wherein one or more of the at least one distributor plates is made of a ceramic material and one or more of the at least one distributor plates is made of a non-electrically-conducting polymer.

17. A temperature controller comprising:
an electrothermal converter having:
(i) at least one heat exchanger;
(ii) at least two electrical semiconductor components with a warm side and a cold side when in operation, the at least two electrical semiconductor components at least partially joined to and situated alternately and in a sandwich fashion between at least one bridge element;
(iii) at least one distributor plate between the at least one heat exchanger and the at least two electrical semiconductors;
wherein there are pluralities of the heat exchangers joined only to pairs of the semiconductor components on the cold side and/or warm side;
wherein the plurality of heat exchangers are situated at intervals next to each other and exert no forces on each other, the pluralities of heat exchangers are joined to each pair of the semiconductor components connected by one of the at least one bridge element;
wherein the at least one distributor plate electrically insulates the at least two electrical semiconductor components and/or the at least one bridge element from the at least one heat exchanger; and
wherein the at least one distributor plate is flexible in one direction and inflexible in another direction.

18. The temperature controller according to claim 17, wherein the distributor plates include ribs or a mountain and valley structure.

* * * * *